United States Patent
Ishikawa et al.

(10) Patent No.: US 9,345,170 B2
(45) Date of Patent: May 17, 2016

(54) HEAT EXCHANGE DEVICE, ELECTRONIC SYSTEM, AND COOLING METHOD OF ELECTRONIC SYSTEM

(71) Applicant: FUJITSU LIMITED, Kawasaki-shi, Kanagawa (JP)

(72) Inventors: Hiroshi Ishikawa, Musashino (JP); Tadao Amada, Kawasaki (JP); Satoshi Shinohara, Kawasaki (JP); Kyoichi Takada, Yokohama (JP); Ken'ichi Ishizaka, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 39 days.

(21) Appl. No.: 14/519,253

(22) Filed: Oct. 21, 2014

(65) Prior Publication Data
US 2015/0131228 A1 May 14, 2015

(30) Foreign Application Priority Data

Nov. 13, 2013 (JP) .................. 2013-235459

(51) Int. Cl.
*H05K 7/20* (2006.01)
*G01M 3/04* (2006.01)
*G01M 3/16* (2006.01)
(Continued)

(52) U.S. Cl.
CPC ............ *H05K 7/20272* (2013.01); *G01M 3/04* (2013.01); *G01M 3/047* (2013.01); *G01M 3/16* (2013.01); *G01M 3/165* (2013.01); *G01M 3/26* (2013.01); *H05K 7/20818* (2013.01); *H05K 7/20827* (2013.01)

(58) Field of Classification Search
CPC .... H05K 7/20272; G01M 3/04; G01M 3/047; G01M 3/16; G01M 3/165; G01M 3/26; G01F 23/00
USPC .............. 361/679.46–679.54, 688–723; 137/15.11; 73/49.1, 40.5 R
See application file for complete search history.

(56) References Cited

U.S. PATENT DOCUMENTS 4,698,728 A * 10/1987 Tustaniwskyj ..... H05K 7/20272
165/104.31
5,086,829 A * 2/1992 Asakawa ........... H05K 7/20281
165/104.33
(Continued)

FOREIGN PATENT DOCUMENTS

JP 62-42044 3/1987
JP 2-209685 8/1990
(Continued)

*Primary Examiner* — Zachary M Pape
(74) *Attorney, Agent, or Firm* — Staas & Halsey LLP

(57) ABSTRACT

A heat exchange device that is coupled to an electronic device that includes an electronic component that generates heat, the heat exchange device includes: a first-channel through which a first-coolant that cools the electronic component flows; a heat-exchange-unit that performs heat exchange between the first-coolant and a second-coolant; a second-channel through which the second-coolant-flows; a first-coolant-detection-unit that detects leakage of the first-coolant from the first-channel; a collection-unit that collects the first-coolant that is leaked from the first-channel; a storage-unit that is provided in the first-channel and supplies the stored first-coolant to the first channel; a recovery-unit that is provided between the collection-unit and the storage-unit; and a control-unit that causes the recovery-unit to recover the first-coolant that is collected by the collection unit, into the storage-unit when the first-coolant-detection-unit detects leakage of the first-coolant.

8 Claims, 15 Drawing Sheets

(51) Int. Cl.
  *G01M 3/26* (2006.01)
  *G01M 3/00* (2006.01)

(56) References Cited

U.S. PATENT DOCUMENTS 7,011,143 B2 * 3/2006 Corrado .................... G06F 1/20
                                                    165/104.33
7,158,039 B2 * 1/2007 Hayashida .............. G01M 3/16
                                                    340/605
8,208,258 B2 * 6/2012 Campbell ............ H05K 7/2079
                                                    165/104.33

FOREIGN PATENT DOCUMENTS

JP      4-282898     10/1992
JP     11-307347     11/1999

* cited by examiner

HEAT EXCHANGE DEVICE, ELECTRONIC SYSTEM, AND COOLING METHOD OF ELECTRONIC SYSTEM

CROSS-REFERENCE TO RELATED APPLICATION

This application is based upon and claims the benefit of priority from the prior Japanese Patent Application No. 2013-235459 filed on Nov. 13, 2013, the entire contents of which are incorporated herein by reference.

FIELD

The embodiments discussed herein are related to a heat exchange device, an electronic system, and a cooling method of the electronic system.

BACKGROUND

In a related art, a cooling technology is known in which a water cooling scheme, the heat exchange effectiveness of which is high as compared with an air cooling scheme, is used in order to cool an electronic component such as a central processing unit (CPU) in a computing system such as a super computer in which a calorific value of the electronic component is large. In the electronic component, the cooling maintains the performance and improves the reliability.

As a heat exchange device that performs heat exchange between a coolant for cooling an electronic component and another coolant different from the coolant, a coolant distribution unit (CDU) is known. The CDU cools electronic components in a plurality of computers by distributing a coolant to the respective computers. The CDU includes a heat exchange unit that performs heat exchange between different coolants, a pump that causes the coolant to flow, and a tank that stores the coolant.

As a technology of the related art, the following technologies are known.

For example, a transformer is known that includes a detection device detecting leakage of a cooling fluid and a recovery device recovering the leaked cooling fluid into an insulation container (for example, see Japanese Laid-open Patent Publication No. 11-307347). In addition, a device is known that includes a drain pan for leaked water and a sensor provided in the drain pan (for example, see Japanese Laid-open Utility Model Publication No. 62-42044). In addition, a device is known that includes a container that stores fluid drained through a decompression valve and a detector that determines whether or not an amount of the drained fluid stored in the container has reached a certain level (for example, see Japanese Laid-open Patent Publication No. 4-282898).

In addition, a device is known that includes a float member that changes the position so as to correspond to a storage amount of cooling water in a main tank, and a valve member that opens and closes a channel in response to the change in the position of the float member (for example, see Japanese Laid-open Patent Publication No. 2-209685).

The fluid channel through which the coolant circulates to cool the electronic component serving as a heat generation source is typically a closed system. When the coolant is leaked from the channel, cooling of the electronic component is not continuously performed. As a result, reduction in the performance of the electronic component may be caused leading to termination of the operation of an electronic device including the heating electronic component.

In addition, the wall of the tube of the channel through which the coolant flows is significantly thin in order to increase the heat exchange effectiveness with the electronic component. Therefore, corrosion inhibitor (for example, rust inhibitor) is often added to the coolant to avoid corrosion of the tube.

In the above-described heat exchange device that uses two different types of coolant, for example, it is assumed here that the corrosion inhibitor is added to a first coolant that cools the electronic component, and the corrosion inhibitor is not added to a second coolant with which the heat exchange between the first and second coolants is performed. In this case, when the second coolant is mixed into the first coolant, corrosion of the tube may be caused due to reduction in the concentration of the corrosion inhibitor in the first coolant.

SUMMARY

According to an aspect of the invention, A heat exchange device that is coupled to an electronic device that includes an electronic component that generates heat, the heat exchange device includes: a first-channel through which a first-coolant that cools the electronic component flows; a heat-exchange-unit that performs heat exchange between the first-coolant and a second-coolant; a second-channel through which the second-coolant-flows; a first-coolant-detection-unit that detects leakage of the first-coolant from the first-channel; a collection-unit that collects the first-coolant that is leaked from the first-channel; a storage-unit that is provided in the first-channel and supplies the stored first-coolant to the first channel; a recovery-unit that is provided between the collection-unit and the storage-unit; and a control-unit that causes the recovery-unit to recover the first-coolant that is collected by the collection unit, into the storage-unit when the first-coolant-detection-unit detects leakage of the first-coolant.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

A heat exchange device, an electronic system, and a cooling method of the electronic system according to embodiments are described below.

Figure 1:
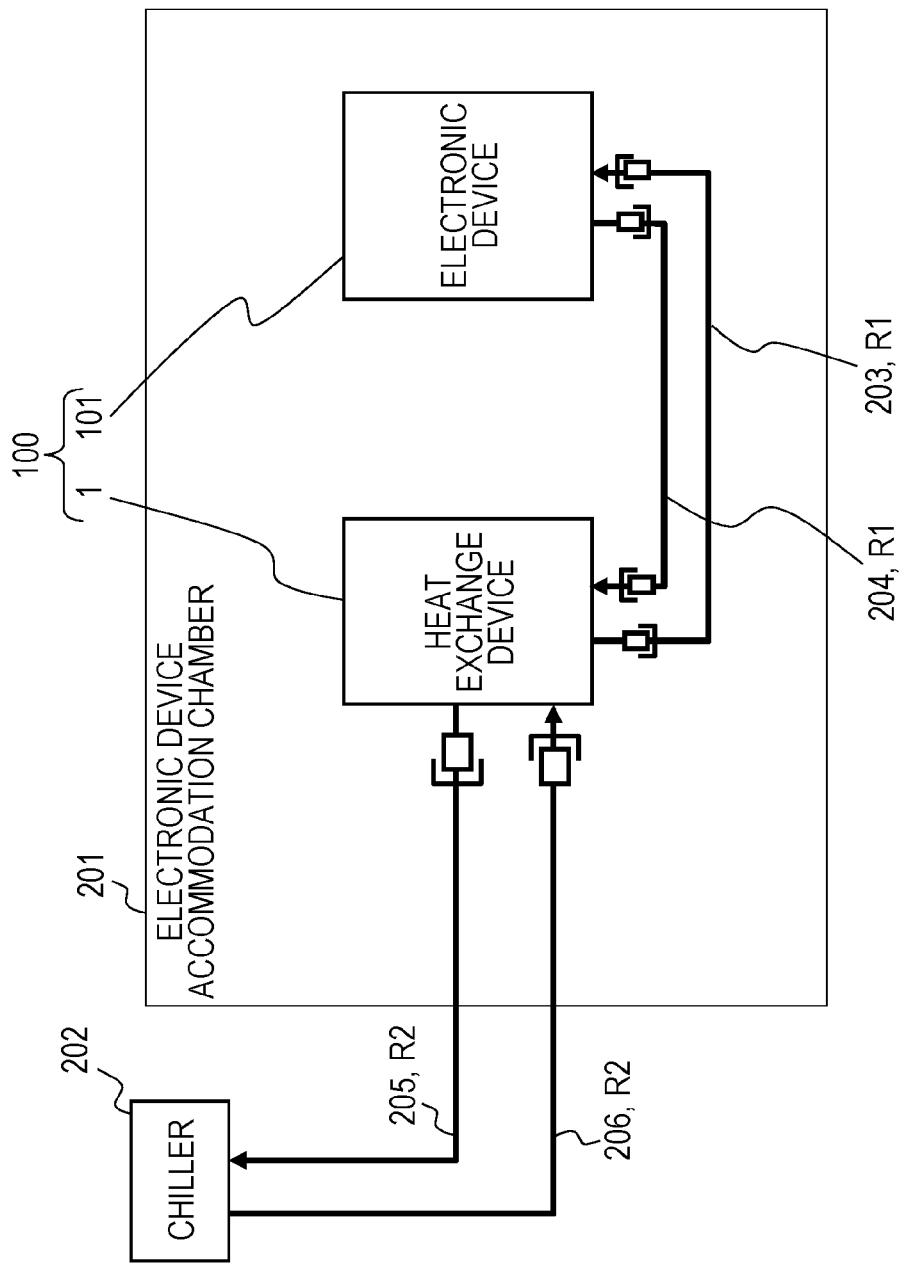
FIG. 1 is a diagram illustrating flows of a first coolant and a second coolant in an electronic system according to an embodiment.

FIG. 1 is a diagram illustrating flows of coolants in an electronic system 100 according to an embodiment.

The electronic system 100 includes a heat exchange device 1 and an electronic device 101. The heat exchange device 1 is accommodated, for example, in an electronic device accommodation chamber 201 in which the electronic device 101 is also accommodated. The heat exchange device 1 may be provided outside the electronic device accommodation chamber 201.

Figure 2:
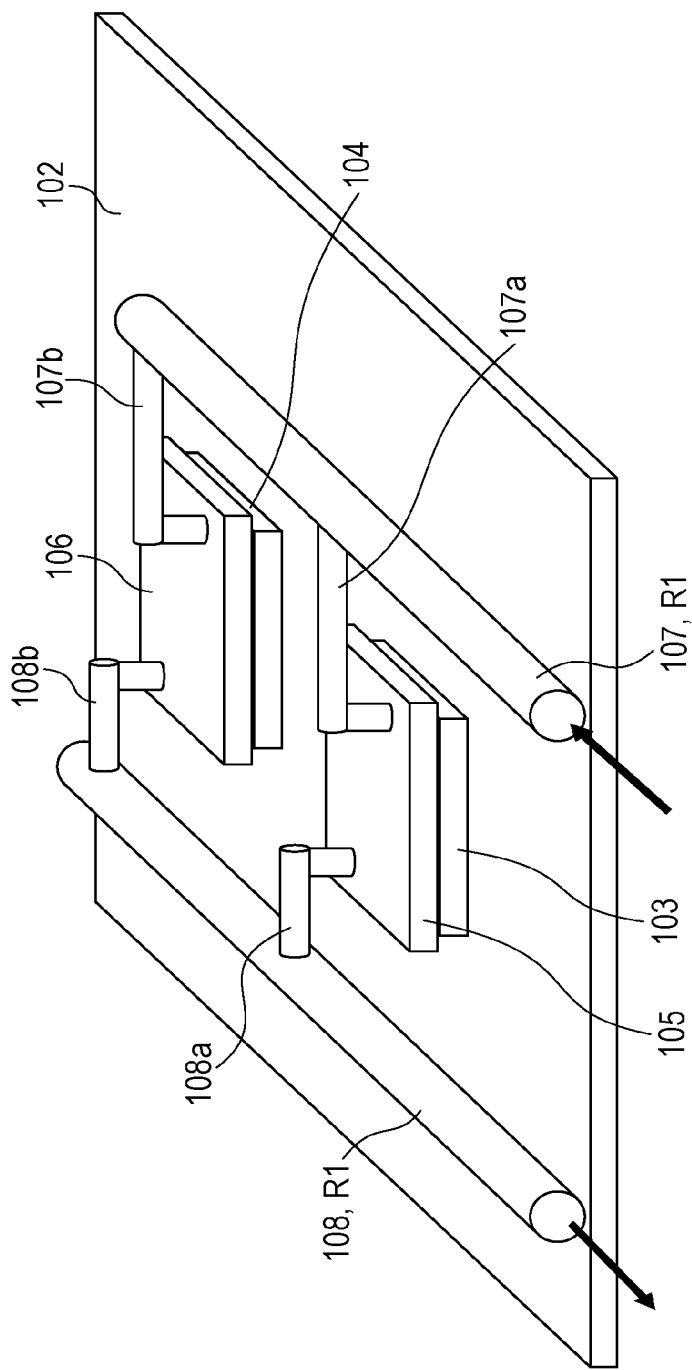
FIG. 2 is a diagram illustrating a flow of the first coolant in an electronic device according to the embodiment.

The electronic device 101 includes electronic components 103 and 104 that generate heat, which are illustrated in FIG. 2. The electronic device 101 is, for example, an information processing device, a storage device, or a communication device.

Between the heat exchange device 1 and the electronic device 101, tubes 203 and 204 through which a first coolant R1 flows are provided. With the tubes, the heat exchange device 1 and the electronic device 101 are coupled to each other. The first coolant R1 is circulated through the heat exchange device 1 and the electronic device 101. For example, corrosion inhibitor that is used to avoid corrosion of the tube is added to the first coolant R1.

Tubes 205 and 206 through which a second coolant R2 flows are provided between the heat exchange device 1 and a chiller 202. The second coolant R2 is circulated through the heat exchange device 1 and the chiller 202. The second coolant R2 is different from the first coolant R1, and corrosion inhibitor might not be added to the second coolant R2. The coolant that is different from the first coolant R1 includes a coolant in which the concentration of at least a part of the components is different from that of the first coolant R1 in addition to a coolant in which at least a part of the components is different from that of the first coolant R1.

The first coolant R1 cools the electronic components 103 and 104 illustrated in FIG. 2 in the electronic device 101. As described later in detail, heat exchange between the first coolant R1 and the second coolant R2 is performed in a heat exchange unit 4 illustrated in FIG. 3. The temperature of the second coolant R2 is increased due to the heat exchange with the first coolant R1, but the thermal energy of a portion of the increased temperature is released by the chiller 202 serving as a heat dissipation device.

Note that a single heat exchange device 1 may supply the first coolant R1 to a plurality of electronic devices 101. In this case, it can be said that the electronic system 100 includes the plurality of electronic devices 101.

In addition, the heat exchange device 1 may be integrally provided with the electronic device 101. When the electronic device 101 is a server device or the like, and is accommodated in a rack, the heat exchange device 1 may also be accommodated in the rack with the electronic device 101.

Figure 3:
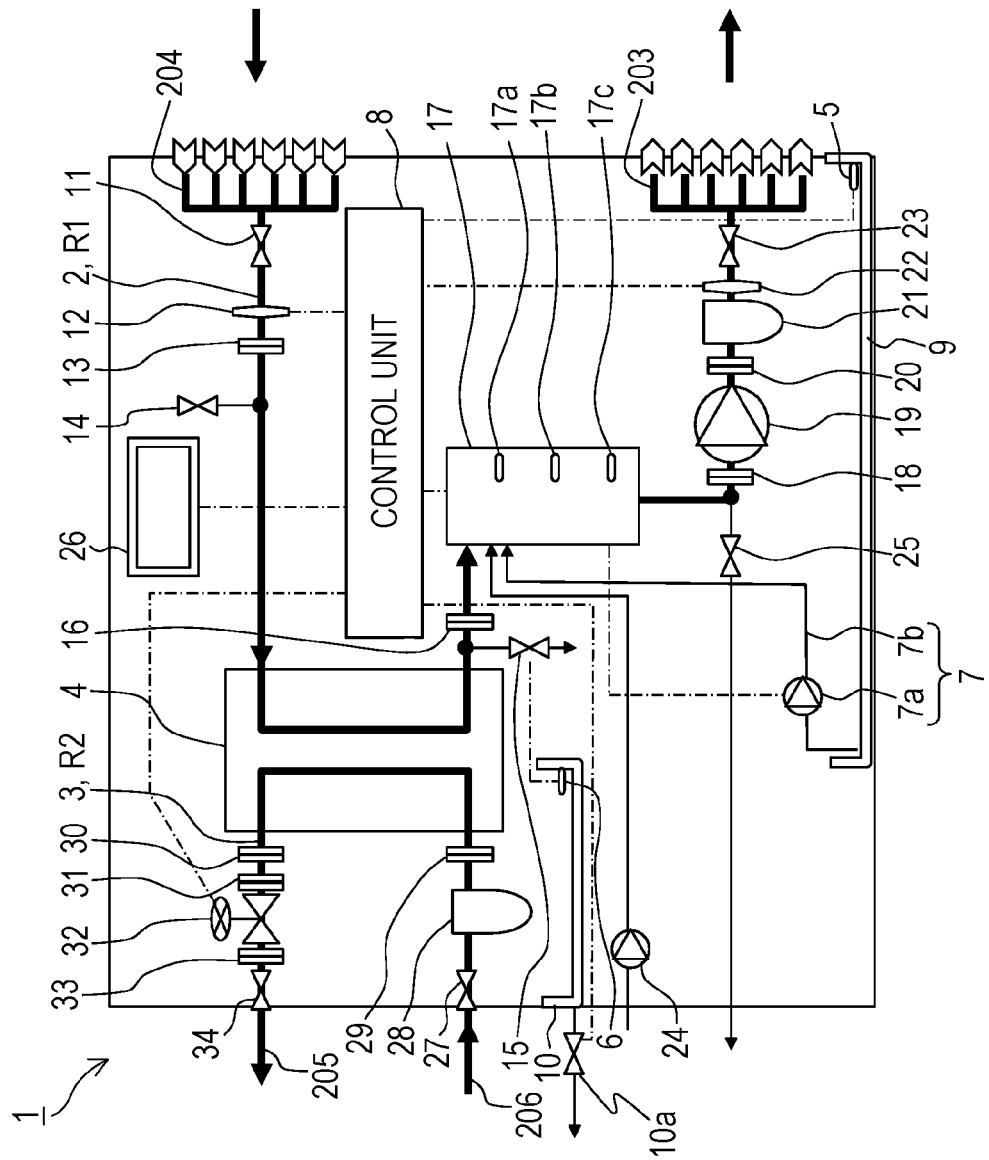
FIG. 3 is a diagram illustrating flows of the first coolant and the second coolant in a heat exchange device according to the embodiment.

FIG. 3 is a diagram illustrating flows of the first coolant R1 and the second coolant R2 in the heat exchange device 1 according to the embodiment.

The heat exchange device 1 includes a first channel 2, a second channel 3, the heat exchange unit 4, a first coolant detection sensor 5, a recovery unit 7, a control unit 8, a first coolant pan unit 9, and a tank 17. The first coolant detection sensor 5 is an example of a first coolant detection unit. The first coolant pan unit 9 is an example of a collection unit. The tank 17 is an example of a storage unit.

In addition, the heat exchange device 1 may include a second coolant detection sensor 6, a second coolant pan unit 10, drain valves 11, 15, 23, 25, 27, and 34, and temperature sensors 12 and 22. In addition, the heat exchange device 1 may include connection units 13, 16, 18, 20, 29, 30, 31, and 33, an air valve 14, a circulation pump 19, filters 21 and 28, a supply pump 24, a dew-point sensor 26, and a flow rate control valve 32.

As illustrated in FIG. 3, one end of the first channel 2 is coupled to the above-described six tubes 203. In addition, the other end of the first channel 2 is coupled to the above-described six tubes 204. As described above, in the example of FIG. 3, the heat exchange device 1 supplies the first coolant R1 to the six electronic devices 101.

The first coolant R1 flows through the first channel 2, the tube 203, the electronic components 103 and 104 illustrated in FIG. 2 of the electronic device 101, and the tube 204, and returns to the first channel 2. The circulation of the first coolant R1 is performed, for example, by the circulation pump 19 of the heat exchange device 1.

As an example illustrated in FIG. 2, the first coolant R1 flows through tubes 107 and 108 in the electronic device 101. The tube 107 is branched into, for example, two branch pipes 107a and 107b. These branch pipes 107a and 107b are respectively coupled to two cooling plates 105 and 106. The cooling plates 105 and 106 are respectively provided on the electronic components 103 and 104 that are mounted on a substrate 102. The cooling plates 105 and 106 release heat that is emitted from the electronic components 103 and 104 using the first coolant R1 that flows from the tube 107.

The cooling plates 105 and 106 are examples of cooling members that cool the electronic components 103 and 104, respectively. The cooling member may have a further shape such as a fin shape or a block shape in addition to the plate shape. In addition, the cooling member may cool the electronic component or a further electronic component by cooling ambient gas that has been heated due to the heating electronic component.

The first coolants R1 that flow in the cooling plates 105 and 106 flow into the tube 108 through branch pipes 108a and 108b, and the first coolant R1 flows to the heat exchange device 1 through the tube 204 illustrated in FIG. 1.

It is desirable that the first channel 2 and the tubes 107, 108, 203, and 204 through which the first coolant R1 flows are sealed.

The second coolant R2 flows through the second channel 3 illustrated in FIG. 3. The second coolant R2 flows through the second channel 3, the tube 205, the chiller 202, and the tube 206 illustrated in FIG. 1, and returns to the second channel 3. The circulation of the second coolant R2 is performed, for example, by a pump that is provided in the tubes 205, 206 or a pump that is provided in the chiller 202.

The heat exchange unit 4 performs heat exchange between the first coolant R1 and the second coolant R2.

The first coolant detection sensor 5 detects, for example, a liquid level of the first coolant R1 that is leaked from the first channel 2, in the first coolant pan unit 9 that is described later. As a position at which the first coolant R1 may be leaked in the first channel 2, there are connection units 13, 16, 18, and 20 that connect the units in the first channel 2 as examples. As described in detail later, the leaked first coolant R1 is recovered to the tank 17 by the recovery unit 7 illustrated in FIG. 4.

When a non-contact sensor such as an ultrasonic sensor, which is not in contact with the first coolant R1, is used, even if the first coolant detection sensor 5 is positioned outside the first coolant pan unit 9, leakage of the first coolant R1 may be detected by monitoring the coolant in the first coolant pan unit 9.

The second coolant detection sensor 6 detects, for example, the second coolant R2 that is leaked from the second channel 3 and caught in the second coolant pan unit 10 that is described later. As the position at which the second coolant R2 may be leaked in the second channel 3, there are connection units 29, 30, 31, and 33 that connect the units in the second channel 3 as examples.

Figure 5:
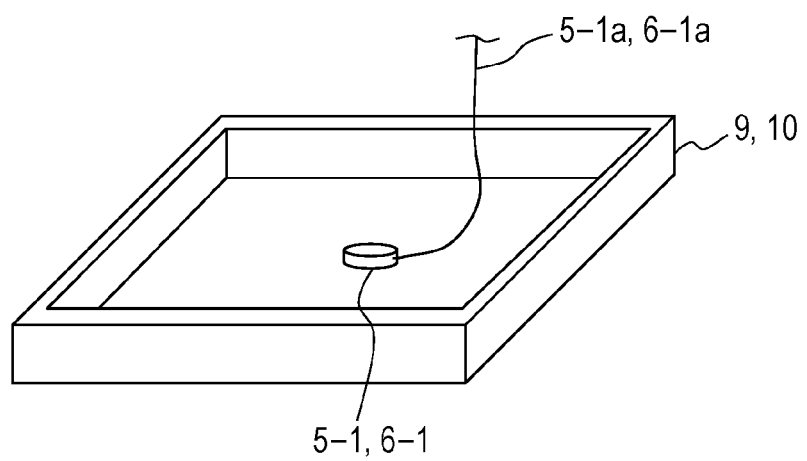
FIG. 5 is a diagram illustrating examples of a first coolant detection sensor and a second coolant detection sensor according to the embodiment.

A detection method is not especially limited as long as the first coolant detection sensor 5 and the second coolant detection sensor 6 detect leakage of the first coolant R1 and the second coolant R2, respectively. For example, the first coolant detection sensor 5-1 and the second coolant detection sensor 6-1 illustrated in FIG. 5 are respectively provided on the bottom surfaces in the first coolant pan unit 9 and the second coolant pan unit 10. The first coolant detection sensor 5-1 and the second coolant detection sensor 6-1 illustrated in FIG. 5 respectively include cables 5-1a and 6-1a each of which is coupled to the control unit 8.

The first coolant detection sensor 5-1 and the first coolant pan unit 9 may have the same shapes as the second coolant detection sensor 6-1 and the second coolant pan unit 10, respectively. Therefore, FIG. 5 illustrates a diagram in which the symbols of the first coolant detection sensor 5-1 and the first coolant pan unit 9, and the symbols of the second coolant detection sensor 6-1 and the second coolant pan unit 10 are illustrated together.

Figure 6:
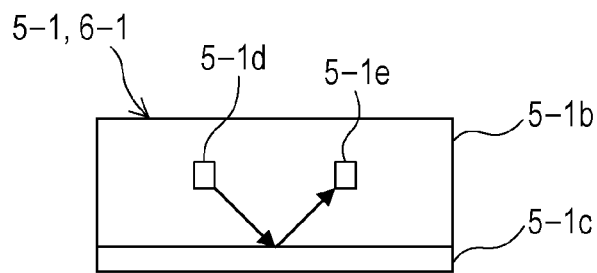
FIG. 6 is a diagram illustrating examples of an optical first coolant detection sensor and an optical second coolant detection sensor according to the embodiment.

The first coolant detection sensor 5-1 and the second coolant detection sensor 6-1 illustrated in FIG. 5 are, for example, optical sensors illustrated in FIG. 6. Each of the optical first coolant detection sensor 5-1 and the optical second coolant detection sensor 6-1 includes, for example, a body unit 5-1b and a liquid absorption unit 5-1c that is provided on the bottom of the body unit 5-1b. The liquid absorption unit 5-1c may be a paper having absorbent.

In the body unit 5-1b, a light emitting element (LED) 5-1d and a light receiving element 5-1e are provided. Light that has been emitted from the LED 5-1d is reflected onto the liquid absorption unit 5-1c, and received by the light receiving element 5-1e. The transmittance of the liquid absorption unit 5-1c is changed depending on whether or not the liquid absorption unit 5-1c absorbs the first coolant R1 or the second coolant R2. Therefore, the presence of leakage of the first coolant R1 or the second coolant R2 may be detected based on the change in the reflected light that is received by the light receiving element 5-1e.

A case is described below in which the first coolant detection sensor 5-1 and the second coolant detection sensor 6-1 are respectively installed on the first coolant pan unit 9 and the second coolant pan unit 10 by using installation units each placed at the lower part of the liquid absorption unit 5-1c. In this case, when the liquid absorption unit 5-1c absorbs the first coolant R1 or the second coolant R2, and the light transmission property is increased, and the light is reflected on the installation unit, the light receiving element 5-1e easily detects leakage of the first coolant R1 or the second coolant R2.

Figure 7:
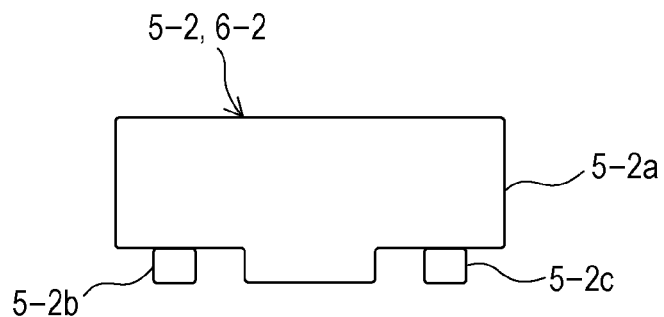
FIG. 7 is a diagram illustrating examples of a first coolant detection sensor and a second coolant detection sensor that operate on a principle of electric conduction in the embodiment.

The first coolant detection sensor 5-1 and the second coolant detection sensor 6-1 illustrated in FIG. 5 may be, for example, a first coolant detection sensor 5-2 and a second coolant detection sensor 6-2 that operate on a principle of electric conduction, which are illustrated in FIG. 7, respectively. Each of the first coolant detection sensor 5-2 and the second coolant detection sensor 6-2 includes a body unit 5-2a and a plurality of terminal units 5-2b and 5-2c that project downward from the body unit 5-2a.

When any of the plurality of terminal units 5-2b and 5-2c are electrically connected by the first coolant R1 or the second coolant R2, the first coolant detection sensor 5-2 and the second coolant detection sensor 6-2 may detect leakage of the first coolant R1 or the second coolant R2. When a liquid absorption unit such as a paper having absorbent is provided under the plurality of terminal units 5-2b and 5-2c, the terminal units 5-2b and 5-2c are easily electrically connected.

As a further example of the first coolant detection sensor 5 and the second coolant detection sensor 6, there are a float sensor that includes a floating unit, a capacitance type sensor, a leak sensor, a pressure sensor, a cable type sensor based on a principle using an electric conduction between a pair of cable shape sensors, and the like. In addition, as a further example, there are an ultrasonic sensor that are not in contact with the first coolant R1 or the second coolant R2 and a strain sensor that operates based on a change in a resistance value of a base portion of the first coolant pan unit 9 or the second coolant pan unit 10.

The recovery unit 7 recovers the first coolant R1 that has been leaked from the first channel 2, into the tank 17 of the first channel 2. The recovery unit 7 recovers, for example, the first coolant R1 that has been leaked and caught in the first coolant pan unit 9, into the tank 17. The first coolant pan unit 9 that is described later separately catches the first coolant R1 from the leaked second coolant R2. Therefore, the recovery unit 7 recovers the leaked first coolant R1 alone into the first channel 2 from among the leaked first coolant R1 and the leaked second coolant R2. The second coolant pan unit 10 separately catches the second coolant R2 from the leaked first coolant R1.

Figure 4:
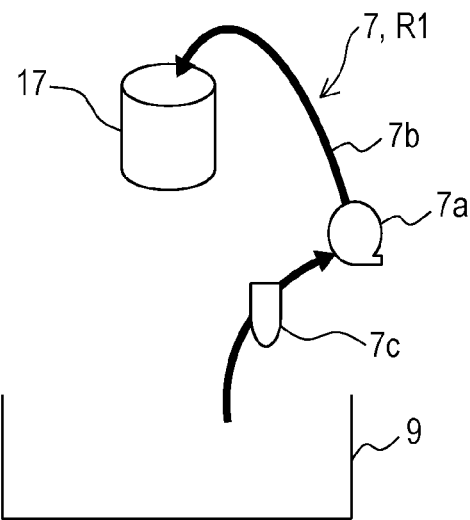
FIG. 4 is a diagram illustrating a flow of the first coolant in a recovery unit according to the embodiment.

As illustrated in FIG. 4, the recovery unit 7 includes a recovery pump 7a, a recovery channel 7b, and a filter 7c.

The recovery pump 7a causes the leaked first coolant R1 to flow through the recovery channel 7b.

The recovery channel 7b is provided between the first coolant pan unit 9 and the tank 17.

The filter 7c removes a foreign matter in the recovery channel 7b. It is desirable that the filter 7c may remove a finer foreign matter as compared with a filter 21 of the first channel 2, which is described later.

When the first coolant detection sensor 5 detects leakage of the first coolant R1, the control unit 8 causes the recovery unit 7 to move the leaked first coolant R1 to the tank 17.

Figure 8:
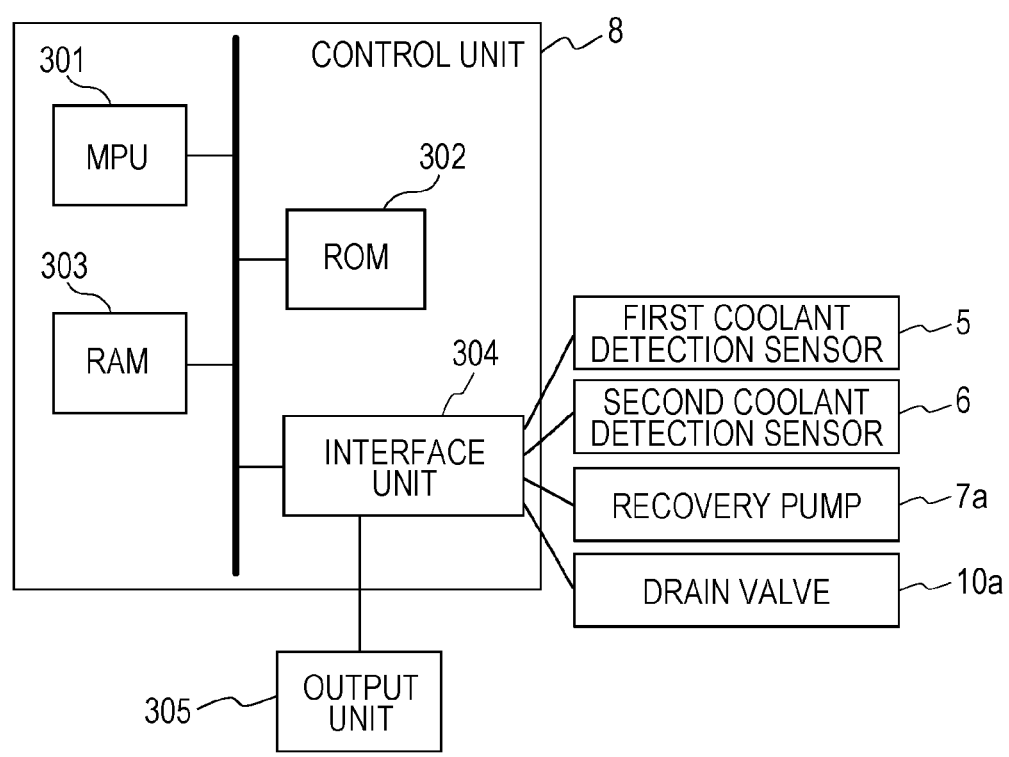
FIG. 8 is a hardware configuration example of a control unit according to the embodiment.

As illustrated in a hardware configuration example of FIG. 8, the control unit 8 includes, for example, a micro-processing unit (MPU) 301, a read only memory (ROM) 302, a random access memory (RAM) 303, and an interface unit 304.

The MPU 301 is a processor that controls an operation of the heat exchange device 1. The MPU 301 executes processing by reading a control program of the heat exchange device 1 and executing the control program.

The ROM 302 is a reading-dedicated semiconductor memory storing a certain control program. As the ROM, a memory such as a non-volatile flash memory in which storage data is not erased for termination of electric power supply may be used.

The RAM 303 is a semiconductor memory that may perform writing and reading at any time and is used as a work storage area as appropriate when the MPU 301 executes various control programs.

As illustrated in FIG. 8, the interface unit 304 manages transmission and reception of information to and from various devices such as the first coolant detection sensor 5, the second coolant detection sensor 6, the recovery pump 7a, a drain valve 10a of the second coolant pan unit 10, and an output unit 305. The interface unit 304 also manages transmission and reception of information to and from further devices such as the temperature sensors 12 and 22, the tank 17, the dew-point sensor 26, and the flow rate control valve 32.

The output unit 305 is a monitor, a lamp, or a buzzer of the heat exchange device 1. The output unit 305 is used for output of a detection result that is described later. At the time of output of the detection result, the monitor displays the detection result, the lamp notices the detection result by changing color or turning on/off, and the buzzer gives an alarm corresponding to the detection result. The output unit 305 may output the detection result by a further method such as sending an e-mail on the detection result.

Figure 9:
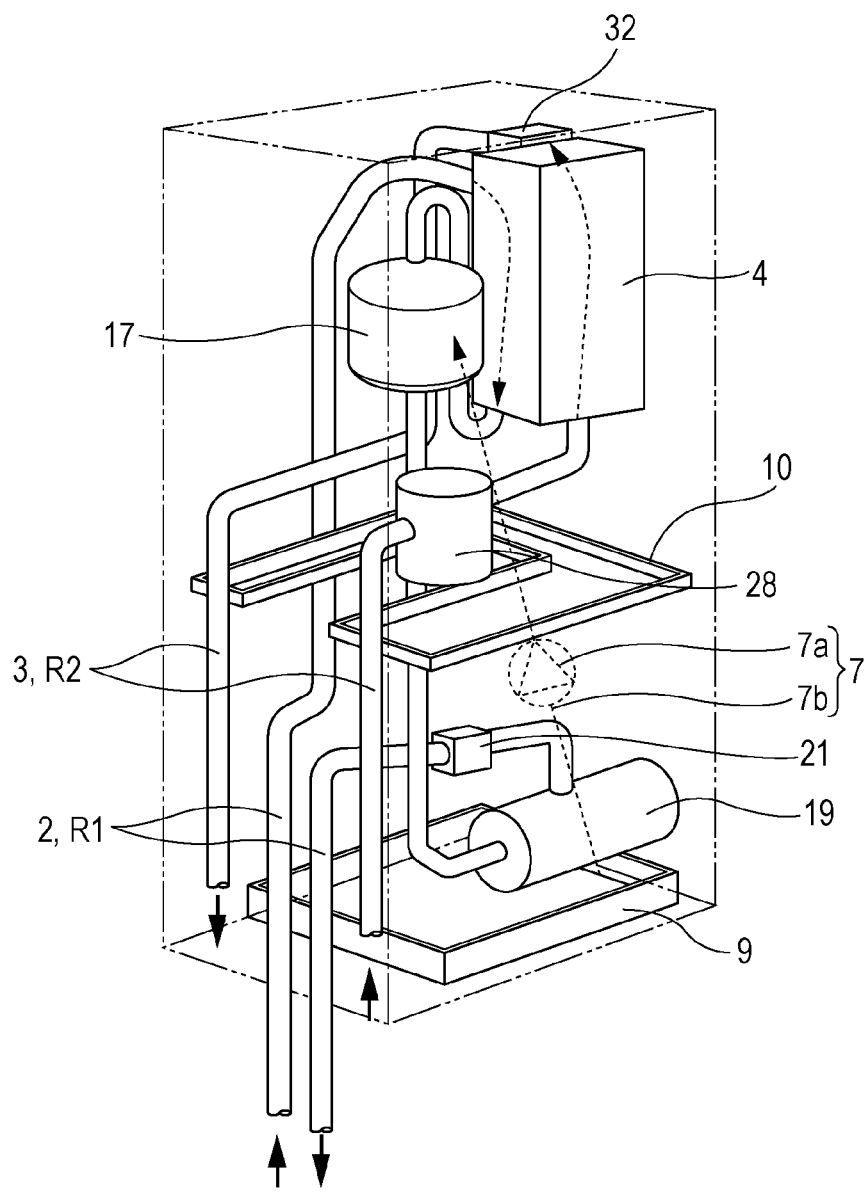
FIG. 9 is a perspective view illustrating a first coolant pan unit and a second coolant pan unit of the heat exchange device according to the embodiment.

The first coolant pan unit 9 catches the leaked first coolant R1 alone from among the leaked first coolant R1 and the leaked second coolant R2. As illustrated in FIG. 9, the first coolant pan unit 9 may be positioned, for example, across the whole footprint (installation area) of the heat exchange device 1 in the lowermost portion of the heat exchange device 1. Note that the height of the first coolant pan unit 9 does not have to be fixed and may be changed along the height of the first channel 2 (for example, the height of the bottom surface in the first coolant pan unit 9). FIG. 9 illustrates configuration elements of the heat exchange device 1 so that some of the configuration elements are omitted.

The second coolant pan unit 10 catches the leaked second coolant R2 alone from among the leaked first coolant R1 and the leaked second coolant R2. As illustrated in FIG. 9, the second coolant pan unit 10 is positioned, for example, above the first coolant pan unit 9. The second coolant pan unit 10 has, for example, a U-shape in plan view. The second coolant pan unit 10 is positioned below the second channel 3, and catches the second coolant R2 that has been leaked from the second channel 3. Note that the height of the second coolant pan unit 10 does not have to be fixed and may be changed along the height of the second channel 3 (for example, the height of the bottom surface in the second coolant pan unit 10).

As illustrated in FIG. 3, in the second coolant pan unit 10, the drain valve 10a through which the second coolant R2 is drained is provided. The second coolant R2 that has been drained from the drain valve 10a is treated outside the heat exchange device 1, for example, as waste water or waste liquid. However, the second coolant R2 may be supplied to the second channel 3 for reuse.

The drain valves 11, 15, 23, 25, 27, and 34 that are provided in the first channel 2 and the second channel 3 illustrated in FIG. 3 are examples of drain valves each of which drains the first coolant R1 from the first channel 2 or drains the second coolant R2 from the second channel 3 at the time of replacement of the various devices in the heat exchange device 1 and the like. The drained first coolant R1 flows, for example, into the first coolant pan unit 9, and the drained second coolant R2 flows, for example, into the second coolant pan unit 10.

The two temperature sensors 12 and 22 that are provided in the first channel 2 detect temperatures of the first coolant R1. The control unit 8 may obtain information on the risen temperature when the first coolant R1 cools the electronic components 103 and 104 illustrated in FIG. 2, based on a difference between temperatures that are respectively detected by the temperature sensors 12 and 22.

The connection units 13, 16, 18, 20, 29, 30, 31, and 33 that are provided in the first channel 2 and the second channel 3 are portions that connect tubes between various devices such as the heat exchange unit 4, the tank 17, the circulation pump 19, and the flow rate control valve 32.

The air valve 14 is an example of a gas release valve that releases gas from the first channel 2.

The tank 17 is provided in the first channel 2, and supplies the stored first coolant R1 to the first channel 2. The first coolant R1 is circulated as described above, so that the first coolant R1 is stored in the tank 17 only temporarily at the time of the operation of the heat exchange device 1.

The tank 17 includes a first liquid level gauge 17a, a second liquid level gauge 17b, and a third liquid level gauge 17c. The first liquid level gauge 17a detects the first coolant R1 at a position that is higher than that of the second liquid level gauge 17b. The second liquid level gauge 17b detects the first coolant R1 at a position that is higher than that of the third liquid level gauge 17c.

When an amount of the first coolant R1 in the tank 17 exceeds an amount that is detected by the first liquid level gauge 17a, the control unit 8 causes the supply pump 24 to stop supplying the first coolant R1 to the tank 17. The supply pump 24 is a pump that newly supplies the first coolant R1 to the tank 17 from a supply source of the first coolant R1.

When an amount of the first coolant R1 in the tank 17 becomes an amount or less, which is detected by the second liquid level gauge 17b, the control unit 8 causes the supply pump 24 to start supplying the first coolant R1 to the tank 17.

When an amount of the first coolant R1 in the tank 17 becomes an amount or less, which is detected by the third liquid level gauge 17c, the control unit 8 causes the circulation pump 19 to stop the circulation of the first coolant R1.

Even when leakage of the first coolant R1 from the first channel 2 does not occur, the first coolant R1 may be reduced, for example, due to release of a vapor of the first coolant R1 through the air valve 14 or the like.

The circulation pump 19 causes the first coolant R1 to be circulated through the first channel 2, the tubes 203 and 204 illustrated in FIG. 1, and the tubes 107 and 108 illustrated in FIG. 2.

The filter 21 that is provided in the first channel 2 removes a foreign matter included in the first coolant R1. A filter 28 that is provided in the second channel 3 removes a foreign matter included in the second coolant R2.

The control unit 8 also controls, for example, a flow rate of the second coolant R2 using the flow rate control valve 32. Due to such flow rate control of the second coolant R2, a heat amount exchanged by the heat exchange unit 4 may be changed, so that the temperature of the first coolant R1 may be adjusted.

The dew-point sensor 26 measures a dew-point temperature. It is desirable that the control unit 8 performs the above-described temperature adjustment for the first coolant R1 based on the dew-point temperature that is measured by the dew-point sensor 26.

Figure 10:
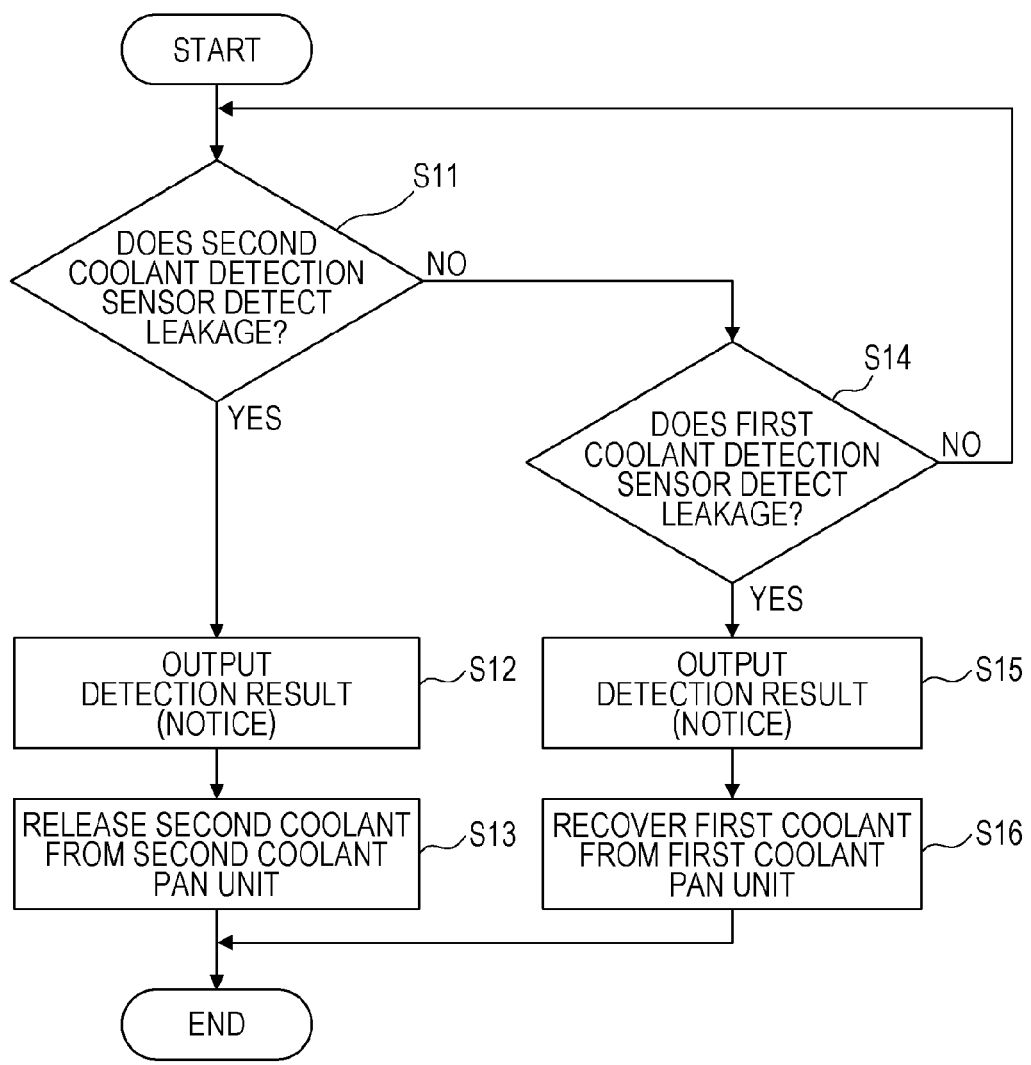
FIG. 10 is a flowchart illustrating a cooling method of the electronic system according to the embodiment.

A flowchart of a cooling method of the electronic system illustrated in FIG. 10 is described below. Each process illustrated in FIG. 10 is executed by the control unit 8 or the like.

First, the control unit 8 monitors whether or not the second coolant detection sensor 6 and the first coolant detection sensor 5 detect leakages of the second coolant R2 and the first coolant R1 (Steps S11 and S14), respectively. That is, the control unit 8 repeats determination of detection of leakage of the second coolant R2 and the first coolant R1 until leakage of the second coolant R2 or the first coolant R1 is detected (No in Steps S11 and S14).

When the second coolant detection sensor 6 detects leakage of the second coolant R2 (Yes in step S11), the control unit 8 sends a notice such as a warning to an administrator of the electronic system 100 by outputting the detection result (step S12). It is desirable that the output of the detection result is performed by the output unit 305 illustrated in FIG. 8. For example, as described above, the output unit 305 includes a monitor that displays the detection result of the heat exchange device 1, a lamp that notices the detection result by changing color or turning on/off, and a buzzer that gives an alarm corresponding to the detection result, and a transmission unit that sends an e-mail and the like.

The control unit 8 causes the leaked second coolant R2 to be drained from the second coolant pan unit 10 through the drain valve 10a (step S13).

When the second coolant detection sensor 6 does not detect leakage of the second coolant R2 (No in step S11), and the first coolant detection sensor 5 detects leakage of the first coolant R1 (Yes in step S14), the control unit 8 outputs the detection result (step S15) similar to the above-described output of the detection result (step S12).

The control unit 8 causes the recovery unit 7 to move the leaked first coolant R1 from the first coolant pan unit 9 to the tank 17 (step S16). As a result, the electronic components 103 and 104 may be continuously cooled using the first coolant R1 alone even if the liquid leakage failure has not yet been handled by an administrator of the heat exchange device 1 or the electronic device 101.

A case is described below in which leakage of one of the first coolant R1 and the second coolant R2 is detected (Yes in step S11 or S14), and the drain of the second coolant R2 (step S13) or the recovery of the first coolant R1 (step S16) is performed as described above. In this case, the control unit 8 may start the processing from the leakage detection determination of the second coolant R2 (step S11) again without termination of the processing of the flowchart illustrated in FIG. 10. In this case, it is merely sufficient that the control unit 8 continues the processing so as to ignore the detected leakage of the first coolant R1 or the second coolant R2 (Yes in S11 or S14) while performing the drainage of the second coolant R2 (step S13) or the recovery of the first coolant R1 (step S16). As a result, even after leakage of one of the first coolant R1 and the second coolant R2 is detected, leakage of the other coolant may be detected.

The drainage of the second coolant R2 (step S13) may be performed not after the output of the detection result (step S12), but at the same time as the output of the detection result (step S12) or before the output of the detection result (step S12). In addition, the recovery of the first coolant R1 (step S16) may be performed not after the output of the detection result (step S15), but at the same time as the output of the detection result (step S15) or before the output of the detection result (step S15).

The second coolant R2 may be drained from the heat exchange device 1 not through the second coolant pan unit 10, so that the above-described processing of drainage of the second coolant R2 (step S13) may be omitted.

Figure 11:
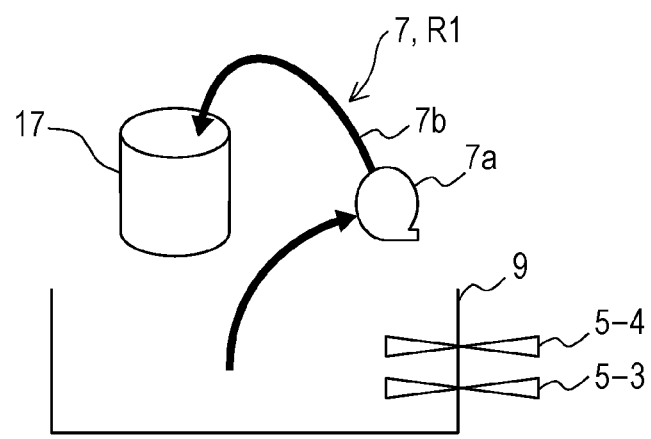
FIG. 11 is a diagram illustrating a lower side detection unit and an upper side detection unit of the first coolant pan unit according to the embodiment.

The first coolant detection sensor 5 illustrated in FIG. 3 may include a lower side detection unit 5-3 and an upper side detection unit 5-4 illustrated in FIG. 11. In addition, the second coolant detection sensor 6 illustrated in FIG. 3 may include a lower side detection unit 6-3 and an upper side detection unit 6-4 illustrated in FIG. 12. The upper side detection units 5-4 and 6-4 respectively detect second liquid levels that are higher than first liquid levels that are detected by the lower side detection units 5-3 and 6-3 and that are higher than the first liquid levels in the first coolant pan unit 9 and the second coolant pan unit 10 (liquid level of the first coolant R1 or the second coolant R2 is high).

In the processing of the flowchart illustrated in FIG. 10, when the first liquid level of the first coolant R1 or the second coolant R2 is detected using the lower side detection unit 5-3 or the first liquid level of the first coolant R1 or the second coolant R2 is detected using the lower side detection unit 6-3, the control unit 8 may perform output of the detection result (Steps S12 and S15). In addition, when the second liquid level of the first coolant R1 or the second coolant R2 is detected using the upper side detection unit 5-4 or the second liquid level of the first coolant R1 or the second coolant R2 is detected using the upper side detection unit 6-4, the control unit 8 may perform the drainage of the second coolant R2 (step S13) or the recovery of the first coolant R1 (step S16).

Figure 13:
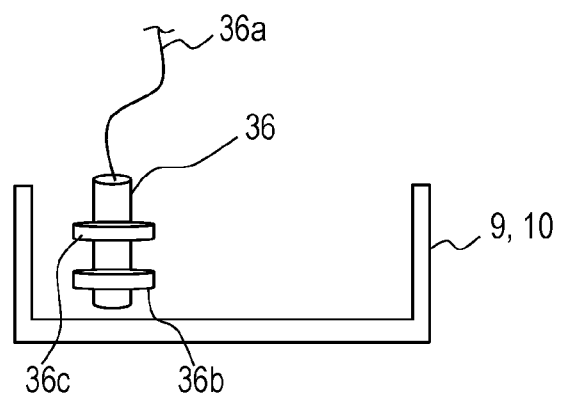
FIG. 13 is a diagram illustrating first examples of the lower side detection unit and the upper side detection unit according to the embodiment.

As illustrated in FIG. 13, the upper side detection unit and the lower side detection unit may be provided in a single sensor 36 that is arranged in the first coolant pan unit 9 or the second coolant pan unit 10. The single sensor 36 includes, for example, a cable 36a that is coupled to the control unit 8, and a lower side detection unit 36b and an upper side detection unit 36c that are floating unit. The single sensor 36 detects a liquid level because the lower side detection unit 36b and the upper side detection unit 36c float when an amount of the first coolant R1 or the second coolant R2 exceeds the positions of the lower side detection unit 36b and the upper side detection unit 36c.

In FIG. 13, and FIGS. 14 to 18 that are described later, the first coolant pan unit 9 may have the same shape as the second coolant pan unit 10. Therefore, FIGS. 13 to 18 illustrate diagrams in which the symbol of the first coolant pan unit 9 and the symbol of the second coolant pan unit 10 are illustrated together.

Figure 14:
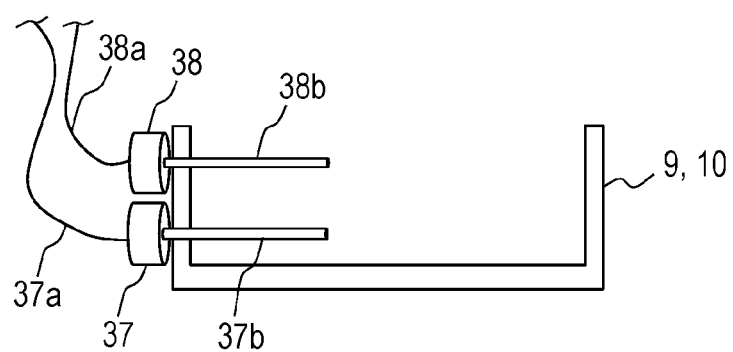
FIG. 14 is a diagram illustrating second examples of the lower side detection unit and the upper side detection unit according to the embodiment.

As illustrated in FIG. 14, the upper side detection unit and the lower side detection unit may be a capacitance type lower side detection unit 37 and a capacitance type upper side detection unit 38 that are provided in the first coolant pan unit 9 or the second coolant pan unit 10. The capacitance type lower side detection unit 37 and the capacitance type upper side detection unit 38 respectively include the cables 37a and 38a that are coupled to the control unit 8, and electrode bars 37b and 38b. Each of the electrode bars 37b and 38b includes a pair of electrodes that performs conduction by the first coolant R1 or the second coolant R2, so that leakage of the coolant is detected.

Figure 15:
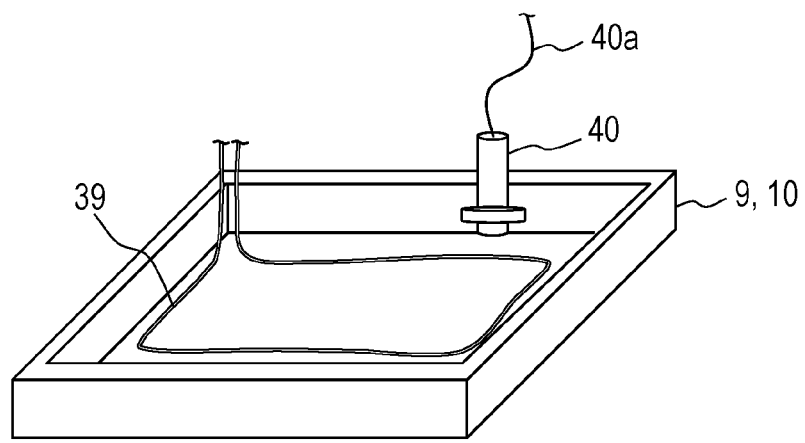
FIG. 15 is a diagram illustrating third examples of the lower side detection unit and the upper side detection unit according to the embodiment.

As illustrated in FIG. 15, the upper side detection unit and the lower side detection unit may be respectively a lower side detection unit 39 and an upper side detection unit 40 that are provided in the first coolant pan unit 9 or the second coolant pan unit 10. The lower side detection unit 39 and the upper side detection unit 40 are examples of different types of detection units. The lower side detection unit 39 is a cable type detection unit based on conduction between a pair of cable type sensors, and is provided along the bottom surface in the first coolant pan unit 9 or the second coolant pan unit 10. The upper side detection unit 40 is a float type detection unit that includes a floating unit. The upper side detection unit 40 includes a cable 40a that is coupled to the control unit 8. The lower side detection unit 39 also includes a cable (not illustrated) that is coupled to the control unit 8.

Figure 16:
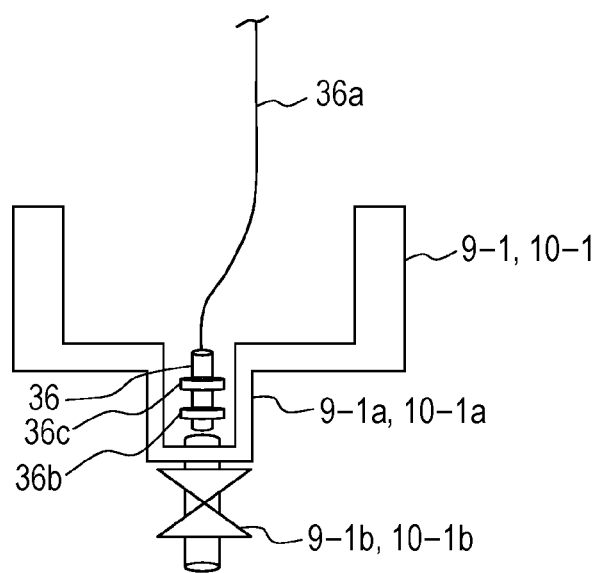
FIG. 16 is a diagram illustrating first examples of the first coolant pan unit and the second coolant pan unit according to the embodiment.

As illustrated in FIG. 16, it is desirable that the above-described single sensor 36 illustrated in FIG. 13 (example of the first coolant detection unit or the second coolant detection unit) is provided in concave parts 9-1a and 10-1a that are respectively formed in the centers of the bottom surfaces in the first coolant pan unit 9 and the second coolant pan unit 10. Drain valves 9-1b and 10-1b are respectively provided in the concave sections 9-1a and 10-1a.

Figure 17:
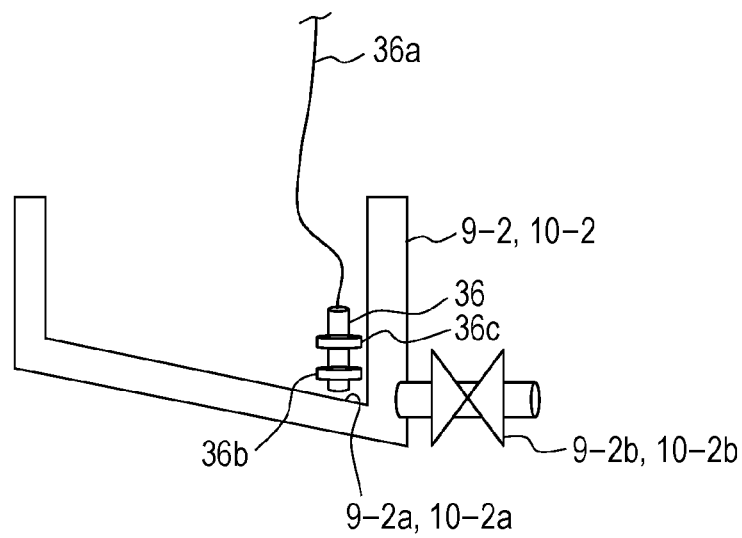
FIG. 17 is a diagram illustrating second examples of the first coolant pan unit and the second coolant pan unit according to the embodiment.

As illustrated in FIG. 17, the single sensor 36 illustrated in FIG. 13 may be provided in the deepest parts 9-2a and 10-2a each of which becomes deeper as it goes from one end to the other end in the bottom surface in each of the first coolant pan unit 9 and the second coolant pan unit 10. Drain valves 9-2b and 10-2b are respectively provided in the deepest parts 9-2a and 10-2a.

Figure 18:
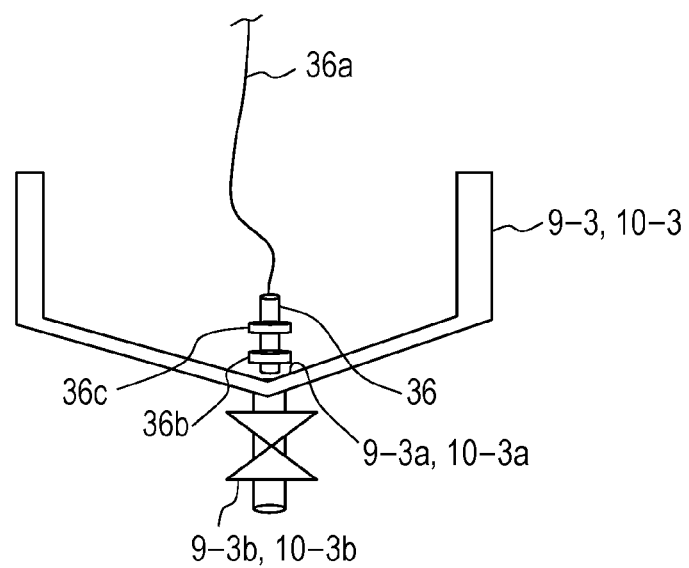
FIG. 18 is a diagram illustrating third examples of the first coolant pan unit and the second coolant pan unit according to the embodiment.

As illustrated in FIG. 18, the single sensor 36 illustrated in FIG. 13 may be provided in the deepest parts 9-3a and 10-3a each of which becomes deeper as it goes from the periphery to the center in the bottom surface in each of the first coolant pan unit 9 and the second coolant pan unit 10. Drain valves 9-3b and 10-3b are respectively provided in the deepest parts 9-3a and 10-3a.

The first coolant R1 in the first coolant pan unit 9 is recovered to the tank 17 by the recovery unit 7, so that the drain valves 9-1b, 9-2b, and 9-3b of the first coolant pan unit 9 illustrated in FIGS. 16 to 18 may be omitted.

The case is described above in which the first coolant R1 and the second coolant R2 are liquid, but at least one of the first coolant R1 in the first channel 2 and the second coolant R2 in the second channel 3 may be gas. When the first coolant R1 is gas in the first channel 2, it is desirable that the recovery unit 7 recovers the first coolant R1 that has been liquefied due to temperature change after leakage.

In addition, for example, as long as a recovery channel is provided in a location at which leakage of the first coolant R1 is to occur in the first channel 2, the first coolant R1 that has been leaked as gas may be recovered to the first channel 2. Alternatively, as long as the first channel 2 is provided in a space of a vacuum state, the first coolant R1 that has been leaked as gas may be collected, so that the collected first coolant R1 may be recovered to the tank 17.

In the above-described embodiment, the first coolant pan unit 9 that is the example of the collection unit collects the first coolant R1 that has been leaked from the first channel 2. The tank 17 that is the example of the storage unit is provided in the first channel 2, and supplies the stored first coolant R1 to the first channel 2. The recovery unit 7 is provided between the first coolant pan unit 9 and the tank 17. When the first coolant detection sensor 5 that is the example of the first coolant detection unit detects leakage of the first coolant R1, the control unit 8 causes the recovery unit 7 to recover the first coolant R1 that has been collected by the first coolant pan unit 9, to the tank 17.

Therefore, it may be avoided that the second coolant R2 is mixed into the first coolant R1. In addition, the electronic components 103 and 104 may be continuously cooled by the first coolant R1 even when the first coolant R1 is leaked from the first channel 2. Thus, in the embodiment, even when coolant leakage occurs, continuous cooling of the electronic components 103 and 104 may be performed only by the first coolant R1.

In addition, in the embodiment, the first coolant detection sensor 5 detects a liquid level of the first coolant R1 in the first coolant pan unit 9.

Therefore, even when the plurality of first coolant detection sensors 5 is not provided in some locations of the first channel 2 respectively, leakage of the first coolant R1 may be detected by the first coolant pan unit 9. When the first coolant detection sensor 5 is provided in each location of the first channel 2 and the second coolant detection sensor 6 is provided in each location of the second channel 3, the position at which the first coolant R1 or the second coolant R2 is leaked may be identified.

In addition, in the embodiment, the first coolant detection sensor 5 includes the lower side detection units 5-3, 36b, 37, and 39 and the upper side detection units 5-4, 36c, 38, and 40. Each of the lower side detection units 5-3, 36b, 37, and 39 detects the first liquid level of the first coolant R1 in the first coolant pan unit 9. Each of the upper side detection units 5-4, 36c, 38, and 40 detects the second liquid level that is higher than the first liquid level of the first coolant R1 in the first coolant pan unit 9. When each of the lower side detection units 5-3, 36b, 37, and 39 detects the first liquid level, the control unit 8 outputs the detection result. In addition, when each of the upper side detection units 5-4, 36c, 38, and 40 detects the second liquid level, the control unit 8 causes the recovery unit 7 to move the first coolant R1 that has been collected by the first coolant pan unit 9, from the first coolant pan unit 9 to the tank 17.

Therefore, before the recovery unit 7 starts recovery of the first coolant R1, a notice such as a warning to the administrator of the electronic system 100 may be sent by output of the detection result. For example, at a stage at which each of the lower side detection units 5-3, 36b, 37, and 39 detects the first liquid level of the first coolant R1, the first coolant R1 is a small amount, so that it may be difficult for the recovery unit 7 to perform recovery of the first coolant R1.

Figure 19:
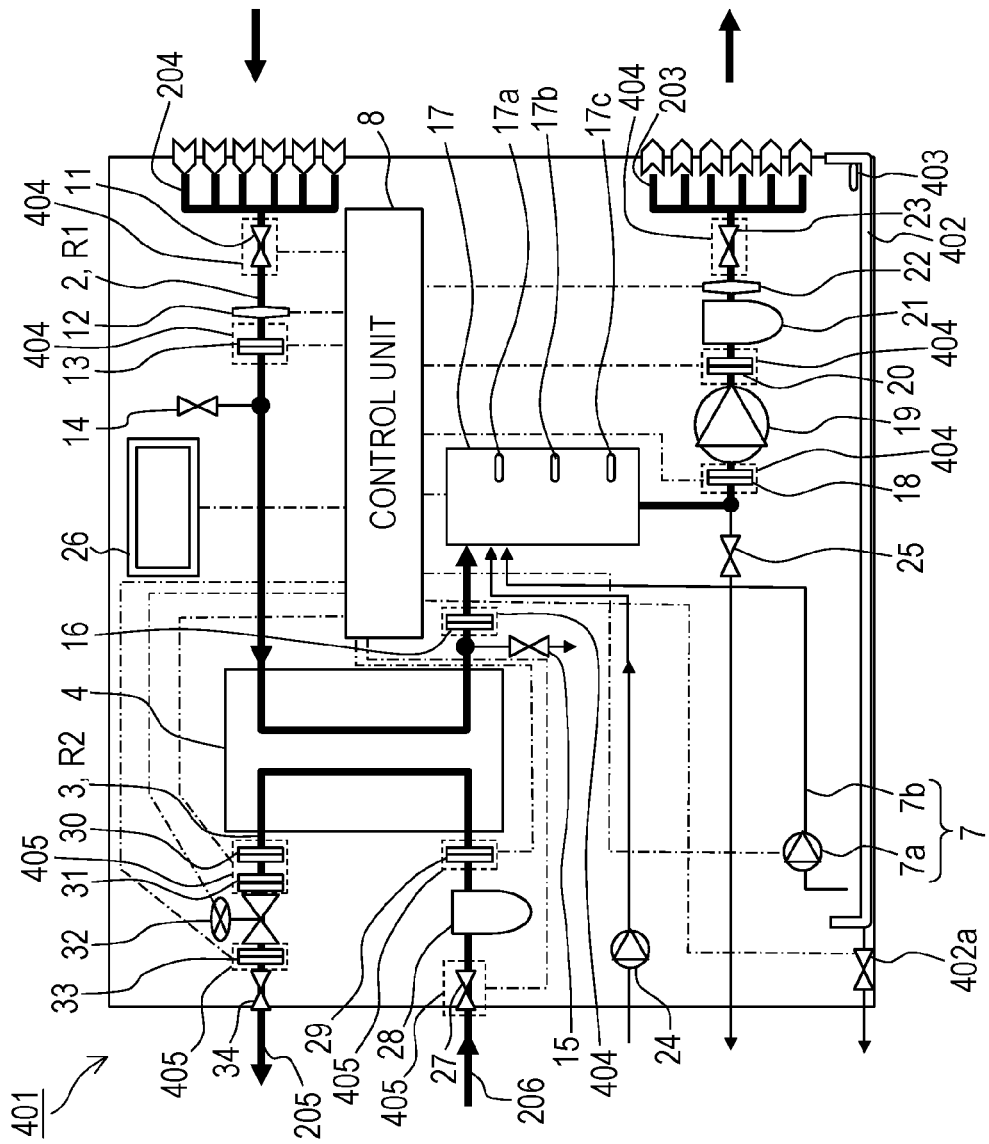
FIG. 19 is a diagram illustrating flows of a first coolant and a second coolant of a heat exchange device according to a further embodiment.

FIG. 19 is a diagram illustrating flows of the first coolant R1 and the second coolant R2 of a heat exchange device 401 according to a further embodiment.

In the embodiment, instead of the first coolant pan unit 9 (example of the collection unit) and the second coolant pan unit 10, a coolant shared pan unit 402 that is an example of a collection unit is provided. A liquid level gauge 403 is provided in the coolant shared pan unit 402. In addition, instead of the first coolant detection sensor 5 and the second coolant detection sensor 6, as an example of the first coolant detection unit and the second coolant detection unit, a first coolant detection sensor 404 that is positioned in each location of the first channel 2 is provided, and a second coolant detection sensor 405 that is positioned in each location of the second channel 3 is provided. Configuration elements of the heat exchange device 401 other than these units are similar to those in the heat exchange device 1 according to the above-described embodiment, so that the description of the configuration elements is omitted herein.

The coolant shared pan unit 402 catches both of the leaked first coolant R1 and the leaked second coolant R2. The coolant shared pan unit 402 includes a drain valve 402a that drains the second coolant R2. The control unit 8 controls open and close of the drain valve 402a. The coolant shared pan unit 402 may be positioned, for example, across the whole footprint (installation area) of the heat exchange device 401 in the lowermost portion of the heat exchange device 401, similar to the first coolant pan unit 9 illustrated in FIG. 9.

The liquid level gauge 403 detects a liquid level in the coolant shared pan unit 402. As described above, since the coolant shared pan unit 402 catches both of the first coolant R1 and the second coolant R2, the control unit 8 does not determine which coolant is leaked based on the detection result alone of the liquid level gauge 403.

It is desirable that the first coolant detection sensors 404 and the second coolant detection sensor 405 are provided, for example, below the connection units 13, 16, 18, 20, 29, 30, 31, and 33, or below the connection units between the first channel 2 and the tubes 203 and 204, and the connection units between the second channel 3 and the tubes 205 and 206, which are illustrated in FIG. 1. The connection units between the first channel 2 and the tubes 203 and 204 and the connection unit between the second channel 3 and the tubes 205 and 206 are, for example, adjacent to the drain valves 23 and 11 at both ends of the first channel 2 and the drain valves 34 and 27 at both ends of the second channel 3.

It is desirable that each of the first coolant detection sensor 404 and the second coolant detection sensor 405 detects leakage of a coolant before the coolant shared pan unit 402 catches the leaked first coolant R1 or the second coolant R2.

Figure 20:
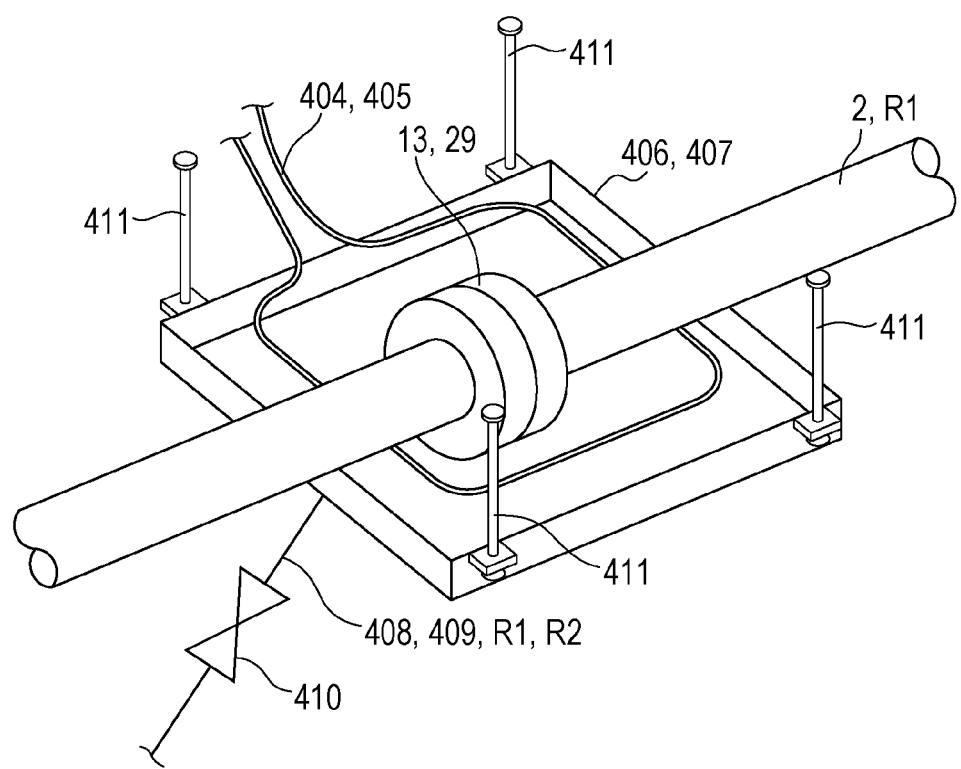
FIG. 20 is a perspective view illustrating a first detection pan unit and a second detection pan unit according to the further embodiment.

Therefore, as illustrated in FIG. 20, it is desirable that the first coolant detection sensor 404 detects, for example, leakage of the first coolant R1 from the connection unit 13 in a first detection pan unit 406. In addition, as illustrated in FIG. 20, it is desirable that the second coolant detection sensor 405, for example, detects leakage of the second coolant R2 from the connection unit 29 in a second detection pan unit 407.

The first coolant detection sensor 404 and the first detection pan unit 406 may have the same shape as the second coolant detection sensor 405 and the second detection pan unit 407, respectively. Therefore, FIG. 20 illustrates a diagram in which symbols of the first coolant detection sensor 404, the second coolant detection sensor 405, and the like, and symbols of the first detection pan unit 406, the second detection pan unit 407, and the like are illustrated together.

The first detection pan unit 406 only catches the first coolant R1 that has been leaked from the first channel 2, from among the first coolant R1 that has been leaked from the first channel 2 and the second coolant R2 that has been leaked from the second channel 3. In addition, the second detection pan unit 407 only catches the second coolant R2 that has been leaked from the second channel 3, from among the first coolant R1 that has been leaked from the first channel 2 and the second coolant R2 that has been leaked from the second channel 3.

As described above, the first coolant detection sensor 404 and the second coolant detection sensor 405 detect leakage of the first coolant R1 and the second coolant R2 by the first detection pan unit 406 and the second detection pan unit 407, respectively. The first coolant detection sensor 404 and the second coolant detection sensor 405 are, for example, cable type sensors based on conduction between the above-described pair of cable shape sensors, and may be sensors by a further detection method.

The first detection pan unit 406 and the second detection pan unit 407 are provided, for example, below the first channel 2 and the second channel 3 so as to catche the leaked first coolant R1 and the leaked second coolant R2, respectively.

Each of the first detection pan unit 406 and the second detection pan unit 407 is suspended from a housing or the like of the heat exchange device 1 by suspension members 411 that are provided at the four corners.

A first leakage coolant channel 408 and a second leakage coolant channel 409 are respectively provided between the first detection pan unit 406 and the second detection pan unit 407, to the coolant shared pan unit 402 illustrated in FIG. 19. Through the first leakage coolant channel 408 and the second leakage coolant channel 409, the leaked first coolant R1 in the first detection pan unit 406 and the leaked second coolant R2 in the second detection pan unit 407 flow, respectively.

It is desirable that a drain valve 410 the open and close of which are controlled by the control unit 8 is provided in the first leakage coolant channel 408 and the second leakage coolant channel 409. It is desirable that pumps that cause the first coolant R1 and the second coolant R2 to flow are provided in the first leakage coolant channel 408 and the second leakage coolant channel 409, respectively.

Figure 21:
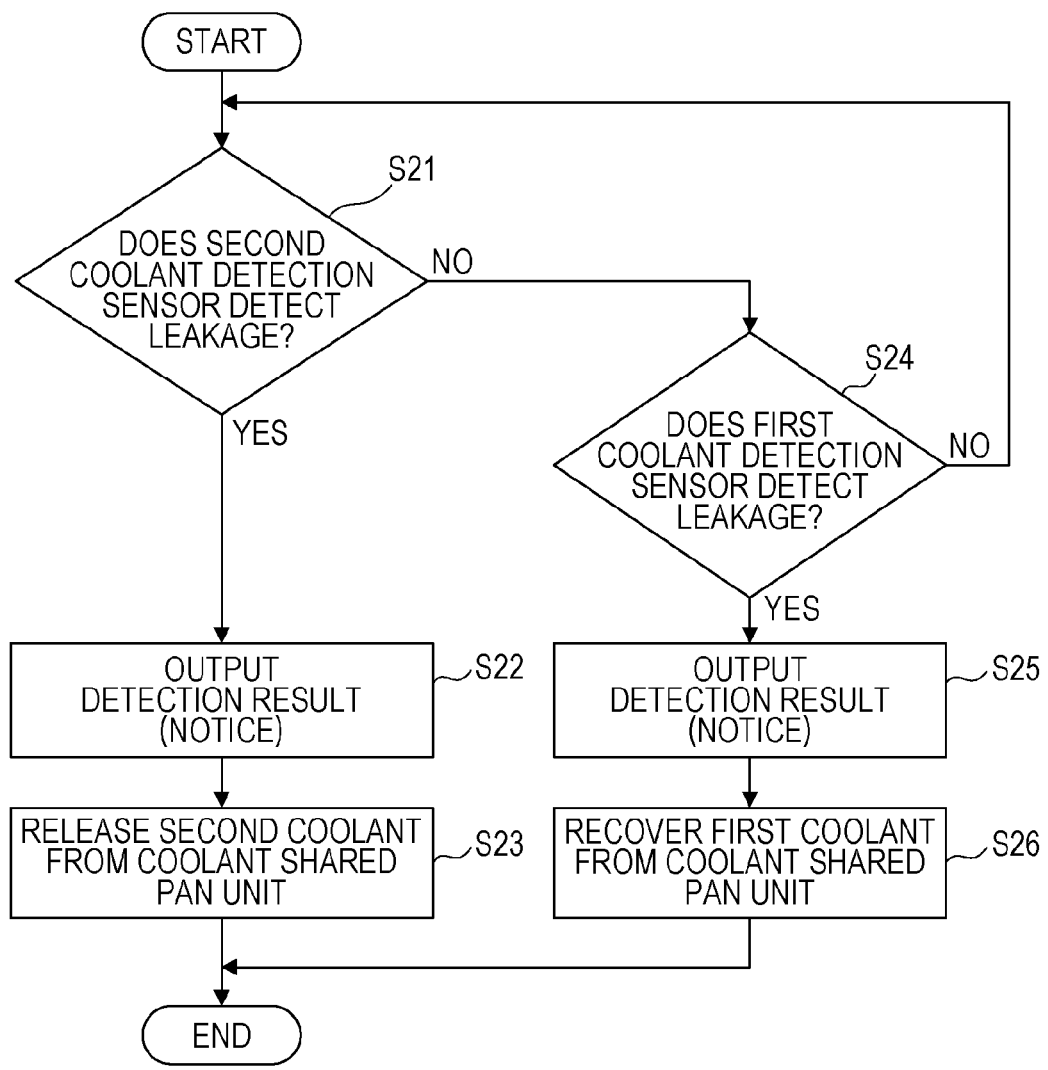
FIG. 21 is a flowchart illustrating a cooling method of an electronic system according to the further embodiment.

A flowchart of a control method of the electronic system, which is illustrated in FIG. 21 is described below. Each piece of processing illustrated in FIG. 21 is executed by the control unit 8 or the like.

First, the control unit 8 monitors whether or not the second coolant detection sensor 405 detects leakage of the second coolant R2 and the first coolant detection sensor 404 detects leakage of the first coolant R1 (Steps S21 and S24). That is, the control unit 8 repeats determination for detection of leakage of the second coolant R2 and the first coolant R1 until leakage of the second coolant R2 or the first coolant R1 is detected (No in Steps S21 and S24).

When the second coolant detection sensor 405 detects leakage of the second coolant R2 (Yes in step S21), the control unit 8 sends a notice such as a warning to an administrator of the electronic system 100 by performing output of the detection result (step S22). The output of the detection result is similar to the above-described output of the detection result illustrated in FIG. 10 (Steps S12 and S15).

After that, the control unit 8 causes the leaked second coolant R2 to be drained from the coolant shared pan unit 402 through the drain valve 402a (step S23).

When the second coolant detection sensor 405 does not detect leakage of the second coolant R2 (No in step S21), and the first coolant detection sensor 404 detects leakage of the first coolant R1 (Yes in step S24), the control unit 8 performs output the detection result (step S25) similar to the above-described output of the detection result (Steps S12, S15, and S22).

After that, the control unit 8 causes the recovery unit 7 to move the leaked first coolant R1 from the coolant shared pan unit 402 to the first channel 2 (step S26).

Figure 12:
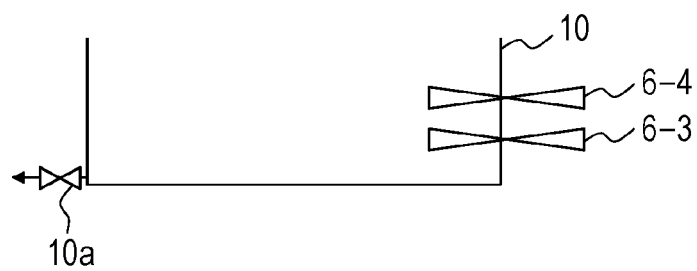
FIG. 12 is a diagram illustrating a lower side detection unit and an upper side detection unit of the second coolant pan unit according to the embodiment.

The first coolant detection sensor 404 and the second coolant detection sensor 405 may respectively include lower side detection units 5-3 and 6-3, and upper side detection units 5-4 and 6-4 illustrated in FIGS. 11 and 12. In this case, in the processing of the flowchart illustrated in FIG. 21, when the lower side detection units 5-3 and 6-3 respectively detect the first liquid levels of the first coolant R1 and the second coolant R2, the control unit 8 may perform the output of the detection result (Steps S22 and S25). In addition, when the upper side detection unit 5-4 detects the second liquid level of the first coolant R1, the control unit 8 may recover the first coolant R1 (step S26), and when the upper side detection unit 6-4 detects the second liquid level of the second coolant R2, the control unit 8 may drain the second coolant R2 (step S23).

In the above-described embodiment, the coolant shared pan unit 402 that is the example of the collection unit collects the first coolant R1 that has been leaked from the first channel 2. The tank 17 that is the example of the storage unit is provided in the first channel 2 and supplies the stored first coolant R1 to the first channel 2. The recovery unit 7 is provided between the coolant shared pan unit 402 and the tank 17. When the first coolant detection sensor 404 that is the example of the first coolant detection unit detects leakage of the first coolant R1, the control unit 8 causes the recovery unit 7 to recover the first coolant R1 that has been collected by the coolant shared pan unit 402, into the tank 17.

Therefore, it may be avoided that the second coolant R2 is mixed into the first coolant R1. In addition, even when the first coolant R1 is leaked from the first channel 2, the electronic components 103 and 104 may be continuously cooled by the first coolant R1. Thus, in the embodiment, even when coolant leakage occurs, continuous cooling of the electronic components 103 and 104 only by the first coolant R1 may be performed.

In addition, in the embodiment, the second coolant detection sensor 405 that is the example of the second coolant detection unit detects leakage of the second coolant R2 from the second channel 3. The coolant shared pan unit 402 collects both of the leaked first coolant R1 and the leaked second coolant R2. In addition, the coolant shared pan unit 402 includes the drain valve 402a that drains the collected second coolant R2. The recovery unit 7 recovers the first coolant R1 that has been collected by the coolant shared pan unit 402, into the tank 17. When the first coolant detection sensor 404 detects leakage of the first coolant R1, the control unit 8 causes the recovery unit 7 to recover the first coolant R1 that has been collected by the coolant shared pan unit 402, into the tank 17. In addition, when the second coolant detection sensor 405 detects leakage of the second coolant R2, the control unit 8 causes the second coolant R2 that has been collected by the coolant shared pan unit 402 to be drained through the drain valve 402a.

Therefore, by the single coolant shared pan unit 402, the leaked first coolant R1 and the leaked second coolant R2 may be caught In addition, in the embodiment, the first detection pan unit 406 catches the leaked first coolant R1 alone, from among the leaked first coolant R1 and the leaked second coolant R2. The first leakage coolant channel 408 is provided between the first detection pan unit 406 and the coolant shared pan unit 402, and the leaked first coolant R1 flows through first leakage coolant channel 408. The first coolant detection sensor 404 detects leakage of the first coolant R1 by the first detection pan unit 406.

Therefore, in the first detection pan unit 406, leakage of the first coolant R1 may be detected further reliably by the first coolant detection sensor 404.

In addition, in the embodiment, the second detection pan unit 407 catches the leaked second coolant R2 alone, from among the leaked first coolant R1 and the leaked second coolant R2. The second leakage coolant channel 409 is provided between the second detection pan unit 407 and the coolant shared pan unit 402, and the leaked second coolant R2 flows through the second leakage coolant channel 409. The second coolant detection sensor 405 detects leakage of the second coolant R2 by the second detection pan unit 407.

Therefore, in the second detection pan unit 407, leakage of the second coolant R2 may be detected further reliably by the second coolant detection sensor 405.

The first coolant detection sensor 404 and the second coolant detection sensor 405 may be respectively provided on the outer peripheral surfaces of the tubes in the first channel 2 are the second channel 3 directly to detect leakage of the first coolant R1 and the second coolant R2. For example, the cable type sensors based on conduction between the above-described pair of cable shape sensors may be provided along the first channel 2 and the second channel 3 as the first coolant detection sensor 404 and the second coolant detection sensor 405, respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat exchange device that is coupled to an electronic device that includes an electronic component that generates heat, the heat exchange device comprising:
   a first channel through which a first coolant that cools the electronic component flows;
   a heat exchange unit that performs heat exchange between the first coolant and a second coolant;
   a second channel through which the second coolant flows;
   a first coolant detection unit that detects leakage of the first coolant from the first channel;
   a collection unit that collects the first coolant that is leaked from the first channel;
   a storage unit that is provided in the first channel and supplies the stored first coolant to the first channel;
   a recovery unit that is provided between the collection unit and the storage unit; and
   a control unit that causes the recovery unit to recover the first coolant that is collected by the collection unit, into the storage unit when the first coolant detection unit detects leakage of the first coolant.

2. The heat exchange device according to claim 1, wherein the first coolant detection unit detects a liquid level of the first coolant in the collection unit.

3. The heat exchange device according to claim 2, wherein the first coolant detection unit includes a lower side detection unit that detects a first liquid level of the first coolant in the collection unit, and an upper side detection unit that detects a second liquid level that is higher than the first liquid level of the first coolant in the collection unit, and
   the control unit outputs a detection result when the lower side detection unit detects the first liquid level, and causes the recovery unit to move the first coolant that is collected by the collection unit, from the collection unit to the storage unit when the upper side detection unit detects the second liquid level.

4. The heat exchange device according to claim 1 further comprising:
   a second coolant detection unit that detects leakage of the second coolant from the second channel, wherein the collection unit collects both of the leaked first coolant and the leaked second coolant, the collection unit has a drain valve that drains the collected second coolant, the recovery unit recovers the first coolant that is collected by the collection unit into the storage unit, and the control unit causes the recovery unit to recover the first coolant that is collected by the collection unit, into the storage unit when the first coolant detection unit detects leakage of the first coolant, and causes the second coolant that is collected by the collection unit to be drained through the drain valve when the second coolant detection unit detects leakage of the second coolant.

5. The heat exchange device according to claim 4 further comprising:
   a first detection pan unit that catches the leaked first coolant alone from among the leaked first coolant and the leaked second coolant; and
   a first leakage coolant channel that is provided between the first detection pan unit and the collection unit and through which the leaked first coolant flows, wherein
   the first coolant detection unit is provided in the first detection pan unit and detects leakage of the first coolant.

6. The heat exchange device according to claim 4 further comprising:
   a second detection pan unit that catches the leaked second coolant alone from among the leaked first coolant and the leaked second coolant; and
   a second leakage coolant channel that is provided between the second detection pan unit and the collection unit, and through which the leaked second coolant flows, wherein
   the second coolant detection unit is provided in the second detection pan unit and detects leakage of the second coolant.

7. An electronic system comprising:
   an electronic device including an electronic component that generates heat; and
   a heat exchange device that includes:
      a first channel through which a first coolant that cools the electronic component flows,
      a heat exchange unit that performs heat exchange between the first coolant and a second coolant,
      a second channel through which the second coolant flows,
      a first coolant detection unit that detects leakage of the first coolant from the first channel,
      a collection unit that collects the first coolant that is leaked from the first channel,
      a storage unit that is provided in the first channel and supplies the stored first coolant to the first channel,
      a recovery unit that is provided between the collection unit and the storage unit, and
      a control unit that causes the recovery unit to recover the first coolant that is collected by the collection unit, into the storage unit when the first coolant detection unit detects leakage of the first coolant.

8. A cooling method of an electronic system that includes an electronic device including an electronic component that generates heat, and a heat exchange device including a first channel through which a first coolant that cools the electronic component flows, a heat exchange unit that performs heat exchange between the first coolant and a second coolant, a second channel through which the second coolant flows, a storage unit that supplies a stored first coolant to the first channel, and a recovery unit that is coupled to the storage unit, the cooling method comprising:
   detecting leakage of the first coolant from the first channel by a first coolant detection unit included in the heat exchange device;
   collecting the first coolant alone that is leaked from the first channel from among the first coolant leaked from the first channel and the second coolant leaked from the second channel by a collection unit in the heat exchange device; and
   causing the recovery unit to recover the first coolant collected by the collection unit into the storage unit by a control unit in the heat exchange device when the first coolant detection unit detects leakage of the first coolant.

\* \* \* \* \*